United States Patent
Wu

(10) Patent No.: US 6,177,306 B1
(45) Date of Patent: Jan. 23, 2001

(54) METHOD FOR FORMING A SILICIDE IN A DYNAMIC RANDOM ACCESS MEMORY DEVICE

(75) Inventor: Tsung-Chih Wu, Hsinchu Hsien (TW)

(73) Assignee: United Microelectronics Corp., Hsinchu (TW)

( * ) Notice: Under 35 U.S.C. 154(b), the term of this patent shall be extended for 0 days.

(21) Appl. No.: 09/192,173

(22) Filed: Nov. 13, 1998

(51) Int. Cl.⁷ .................................................. H01L 21/8242
(52) U.S. Cl. .......................... 438/241; 438/155; 438/396
(58) Field of Search .................................... 438/241, 200, 438/275, 302, 155, 253, 255, 396; 430/316, 320, 323, 253

(56) References Cited

U.S. PATENT DOCUMENTS

| | | | |
|---|---|---|---|
| 5,702,988 | * 12/1997 | Liang | 438/238 |
| 5,731,130 | * 3/1998 | Tseng | 430/316 |
| 5,834,349 | * 11/1998 | Tseng | 438/253 |
| 5,994,176 | * 11/1999 | Wu | 438/200 |
| 6,074,908 | * 6/2000 | Huang | 438/241 |

\* cited by examiner

Primary Examiner—David Nelms
Assistant Examiner—Phuc T. Dang
(74) Attorney, Agent, or Firm—Charles C.H. Wu; Charles C.H. Wu & Associates

(57) ABSTRACT

A method for fabricating a DRAM with a silicide layer formed on a gate of a MOS transistor in a memory region is provided. The method not only forms a first silicide layer on a first MOS transistor at the periphery region as a conventional structure but also forms a second silicide layer on a gate of a second MOS transistor, at the memory region. The second silicide layer is formed on a polysilicon layer before the polysilicon is patterned to form a gate so that the gate includes the second silicide layer on it top. An insulating layer is also formed over the substrate before the polysilicon is patterned so that the insulating layer serve as a mask when an interchangeable source/drain region of the second MOS transistor is formed.

16 Claims, 4 Drawing Sheets

METHOD FOR FORMING A SILICIDE IN A DYNAMIC RANDOM ACCESS MEMORY DEVICE

BACKGROUND OF THE INVENTION

1. Field of the Invention

This invention relates to semiconductor fabrication, and more particularly to a method for forming a suicide layer on a gate of a memory transistor in a dynamic random access memory (DRAM) device, and a gate and an interchangeable source/drain region of a periphery transistor in a periphery circuit of the DRAM device.

2. Description of Related Art

A DRAM is a kind of volatile memory. The DRAM includes a large number of memory cells and a periphery circuit, in which each memory cell includes a single transistor, such as a metal-oxide semiconductor (MOS) transistor with a capacitor, and can be randomly accessed. Each gate of the MOS transistors is electrically coupled to a word line, and one interchangeable source/drain region is electrically coupled to a bit line. The DRAM also includes an address decoder and a periphery circuit for an operation of the memory cells.

FIGS. 1A–1C are cross-sectional views of a DRAM device, schematically illustrating a conventional fabrication method for forming a silicide layer in the DRAM device. In FIG. 1A, a field oxide (FOX) layer 10 is formed on a semiconductor substrate 100 by thermal oxidation. The substrate 100 is also divided into two regions: a memory region 150 and a periphery region 160. A gate oxide layer 12 is formed over the substrate 100 by thermal oxidation. A polysilicon layer 14 is formed on the gate oxide layer 12. Patterning the polysilicon layer 14 and the gate oxide layer 12 forms a gate 50 at the memory region 150 and a gate 52 at the periphery region 160. Using the gates 50, 52 and the FOX layer 10 as a mask, a lightly doped region 16 is formed in the substrate 100. The lightly doped region 16 is a pre-processed region in order to form an interchangeable source/drain region with a lightly doped drain (LDD) structure on each side of the gates 50, 52.

In FIG. 1B, an insulating layer 18 is formed over the substrate 100. An etching back process is performed to etch the insulating layer 18 at the periphery region 160 so that the portion of the insulating layer 18 at the periphery region 160 is removed but leaves a residue, which forms a spacer 20 on each side of the gate 52. Here, a photoresist layer (not shown) has been involved serving as an etching mask. A doping process is performed to form a heavily doped region 22, in which the spacer 20 and the insulation layer 18 serve as a doping mask. The interchangeable source/drain region including the lightly doped region 16 and the heavily doped region 22 forms the LDD structure in the substrate 100 on each side of the gate 52. A MOS transistor including the gate 52 and the interchangeable source/drain region is formed at the periphery region 160.

In FIG. 1C, a silicide process is performed to form a silicide layer 24 on the polysilicon layer 14 of the gate 52 and on the heavily doped region 22. An etching back process is performed to remove the insulating layer at the memory region 150. A residue of the insulating layer 18 forms a spacer 26 on each side of the gate 50 at the memory region 150.

The rest fabrication processes to accomplish a DRAM device are well known by the one skilled the art, and are not further described here.

In this convention fabrication method, the silicide process is only performed at the periphery region 160. The reason is following. Even though the silicide layer 24 can increase the conductivity on the gate 52 and the interchangeable source/drain region of the MOS transistor at the periphery region 160, the silicide layer 24 also consumes the junction depth of the interchangeable source/drain. This may more severely cause a charge leakage to the substrate as the device dimension is more greatly reduced. Since each the memory cell in the DRAM uses a capacitor for storing information, if charges stored in the capacitor are leaking to the substrate, it gets more difficult to recharge the capacitor. This causes an access speed is reduced or even causes an error of information stored in the capacitor. That is why the silicide process is not performed on the MOS transistor 50 at the memory region 150.

Since the each memory cell is desired to have a fast access speed, if there is no silicide included, the access speed on the each memory cell cannot be increased. This is the main drawback of the conventional method for fabricating a DRAM device.

SUMMARY OF THE INVENTION

It is therefore an objective of the present invention to provide a method for fabricating a DRAM with a silicide layer on a gate of a MOS transistor in a memory region so as to increase the access speed on the MOS transistor. A MOS transistor at the periphery region still has a conventional silicide layer on it.

In accordance with the foregoing and other objectives of the present invention, a method for fabricating a DRAM with a silicide layer on a gate of a MOS transistor in a memory region is provided. The method includes forming a field oxide (FOX) layer on a substrate, which is divided into a memory region and a periphery region. Forming an oxide layer over the substrate by thermal oxidation. A polysilicon layer is formed on the oxide layer. Patterning the polysilicon layer and the oxide layer at the periphery region forms a first gate structure, which includes the patterned polysilicon layer and the oxide layer that serves as a gate oxide layer. A portion of the substrate on each side of the first gate structure is exposed. A first interchangeable source/drain region preferably with a lightly doped drain (LDD) structure is formed on each side of the first gate in the exposed substrate. A self-aligned silicide process is performed to form a silicide layer on the first gate and the first interchangeable source/drain region at the periphery region, and a silicide layer on the polysilicon layer at the memory region. An insulating layer is formed over the substrate. At the memory region, the insulating layer, the silicide layer, the polysilicon layer and the oxide layer are patterned to form a second gate structure on the substrate. A portion of the substrate on each side of the second gate structure is exposed. The insulating layer at the periphery region still remains. A lightly doped region is formed in the substrate at the exposed portion. A spacer is formed on each side of the second gate structure. A heavily doped region is formed in the substrate at the memory region. A second interchangeable source/drain region on each side of the second gate in the substrate is thereby formed at the memory region.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

An improved method of the invention not only forms a first silicide layer on a first MOS transistor at the periphery region but also forms a second silicide layer on a gate of a second MOS transistor, at the memory region. The second silicide layer can increase an access speed of a memory cell, which includes the second MOS transistor and a capacitor, without depleting charges stored in the capacitor.

Figure 1A:
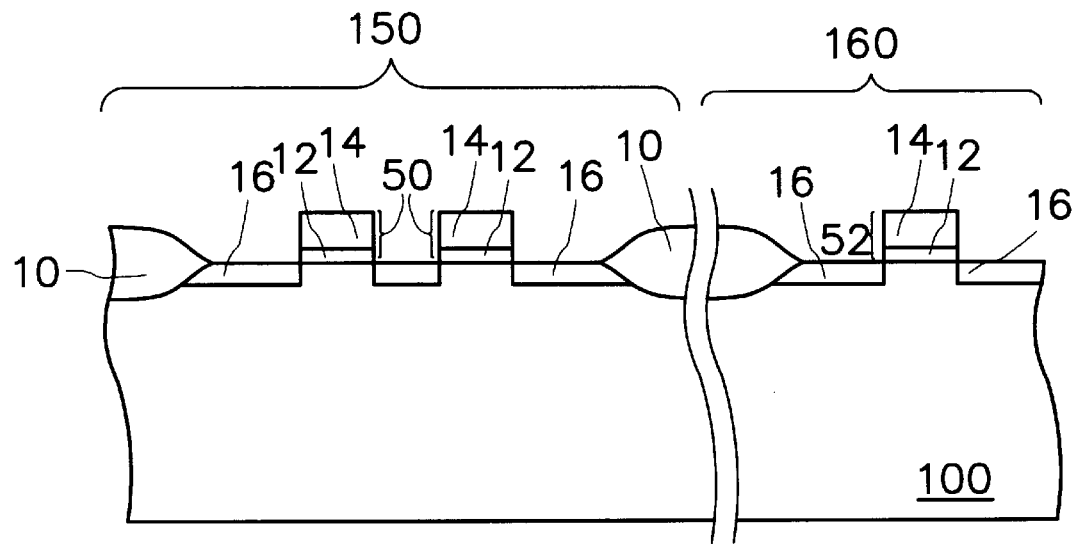
FIGS. 1A–1C are cross-sectional views of a DRAM device, schematically illustrating a conventional fabrication method for forming a silicide layer in the DRAM device.
Figure 1B:
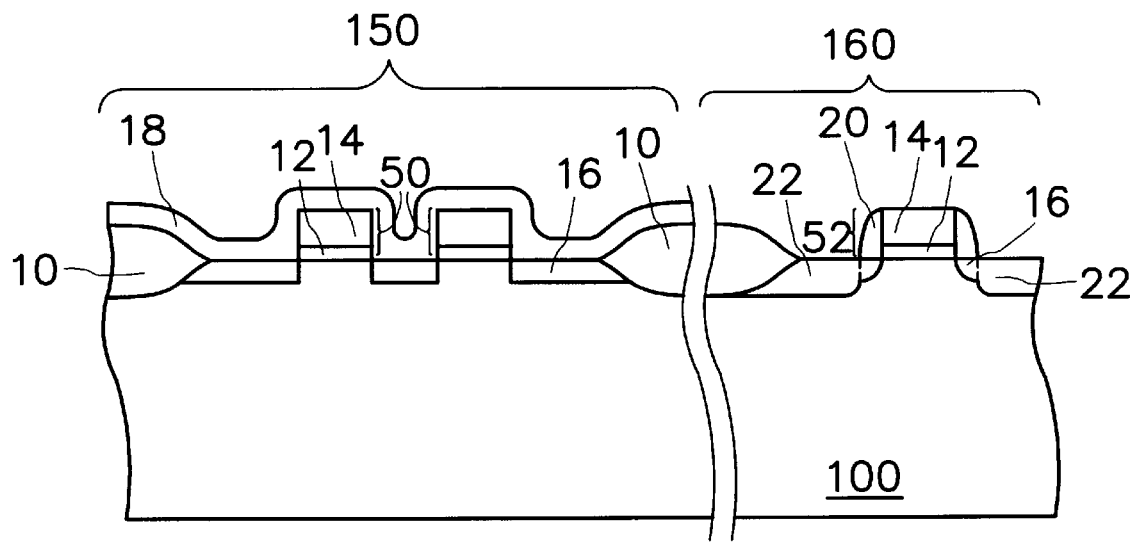
Figure 1C:
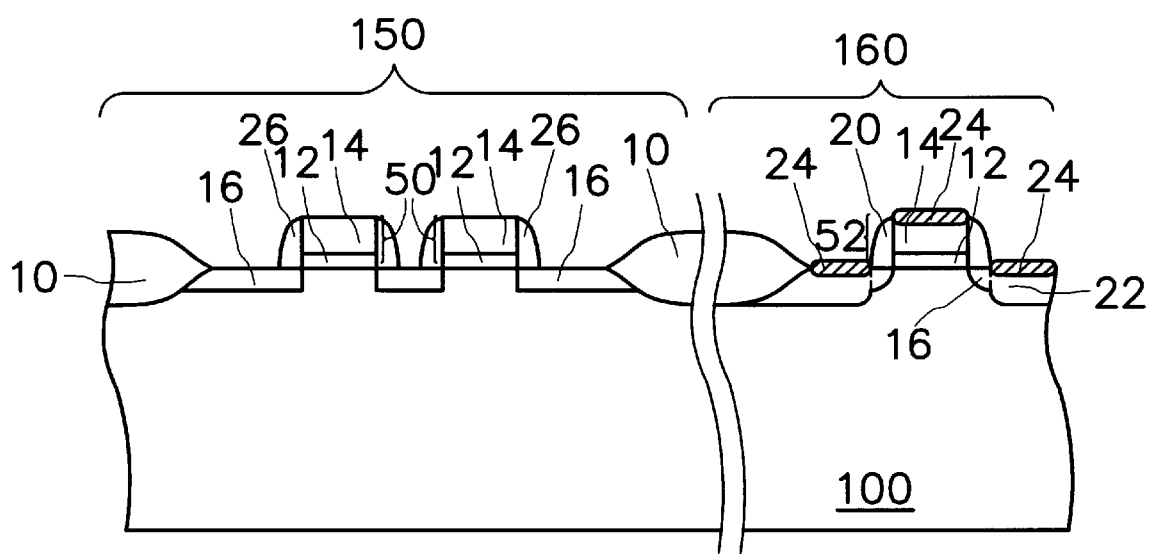
Figure 2A:
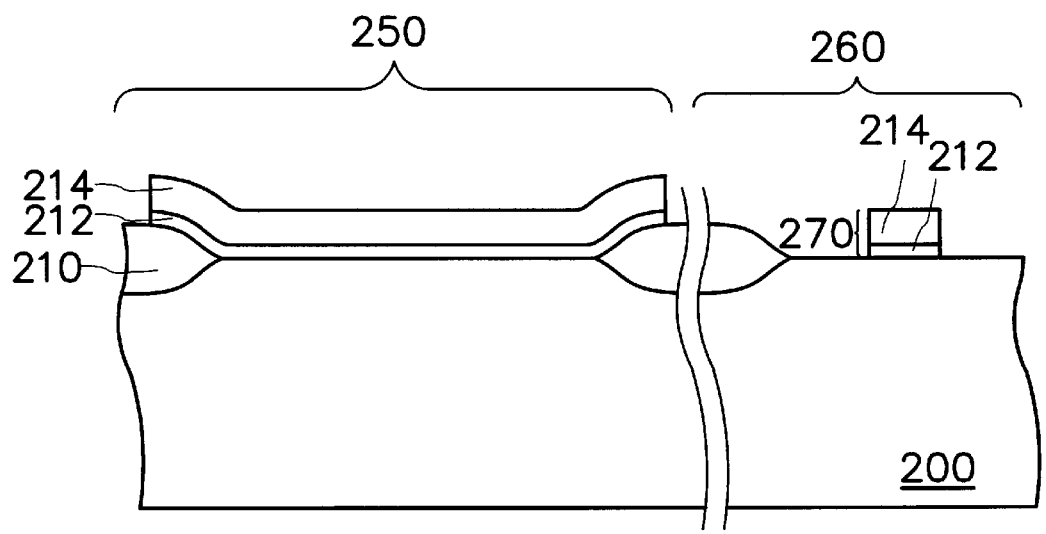
FIGS. 2A–2D are cross-sectional views of a DRAM device, schematically illustrating an improved fabrication method for forming a silicide layer in the DRAM device.

FIGS. 2A–2D are cross-sectional views of a DRAM device, schematically illustrating an improved fabrication method for forming a silicide layer in the DRAM device. In FIG. 2A, an isolation structure is formed on a semiconductor substrate 200, such as a P-type silicon substrate. The isolation structure can include a shallow trench isolation (STI) structure or a field oxide (FOX) structure. A FOX structure 210 is used as an example. The FOX structure 210 is formed by, for example, a local oxidation (LOCOS) process. The substrate 200 is also divided into a memory region 250 and a periphery region 260. The memory region 250 usually includes several memory cells, each of which further includes a metal-oxide semiconductor (MOS) transistor and a capacitor so as to store data or information. The periphery region usually includes a periphery circuit for an operation of access on the memory cells. A gate oxide layer 212 is formed over the substrate 200 by a thermal oxidation process, such as a dry oxidation process. A polysilicon layer 214 is formed on the gate oxide layer 212 by, for example, low pressure chemical mechanical deposition (LPCVD). The polysilicon layer 214 and the gate oxide layer 212 is patterned to form a gate structure 270 on the substrate 200 at periphery region 260.

Figure 2B:
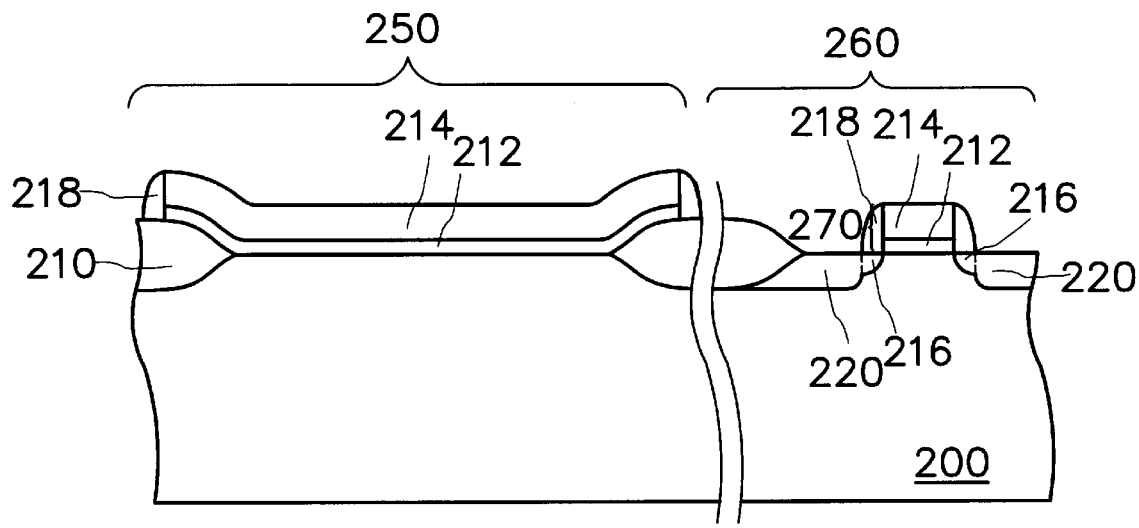

In FIG. 2B, using the gate structure 270 as a mask, a lightly doping process is performed to form a lightly doped region 216 on each side of the gate structure 270 in the substrate 200. A spacer 218 is formed on each sidewall of the gate structure 270. The spacer 218 also simultaneously forms on each sidewall of the polysilicon layer 214 and the gate oxide layer 212 at the memory region but plays no essential role. A heavily doping process is performed to form a heavily doped region 220 on each side of the gate structure 270 so that a first interchangeable source/drain region including the lightly doped region 216 and the heavily doped region 220 is formed on each side of the gate structure in order to form a MOS transistor at the periphery region. The first interchangeable source/drain region has the lightly doped drain (LDD) structure.

Figure 2C:
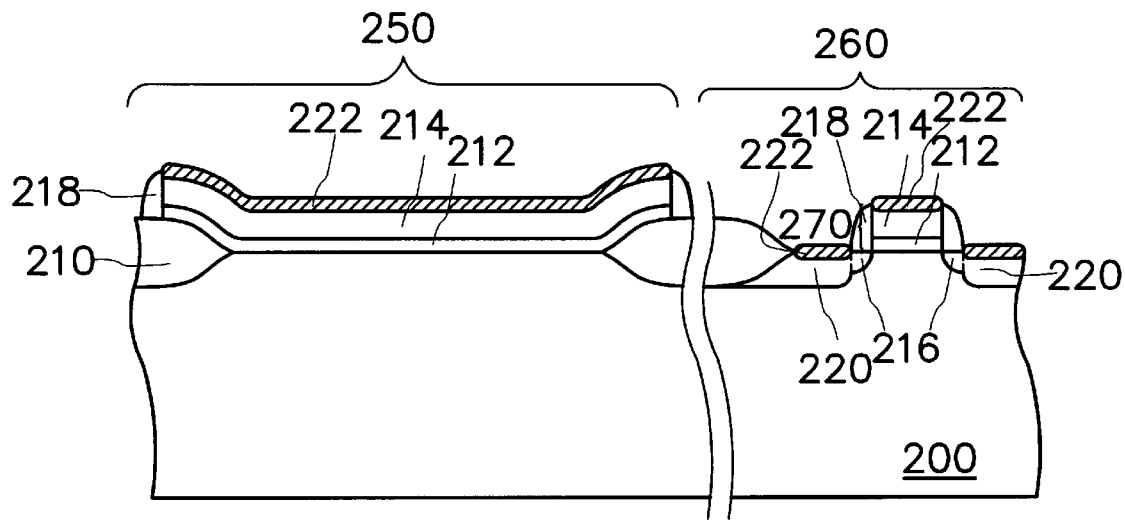

In FIG. 2C, a self-aligned silicide (Salicide) layer 222 is formed over the polysilicon layer 214 and the first interchangeable source/drain region. The formation of the Salicide layer 222 includes forming a metal layer (not shown) over the substrate 200 by, for example, physical vapor deposition (PVD). The metal layer includes, for example, titanium, cobalt, or platinum. A sufficiently high temperature thermal process is performed to induce a reaction at the interface between the metal layer and a silicon-material layer, which is the polysilicon layer 214 and the first interchangeable source/drain region. Thus, the Salicide layer 222 on the interface is formed. A wet etching process, using a solvent, is performed to remove the portion of the metal layer without reaction. The Salicide layer 222 is accomplished.

Figure 2D:
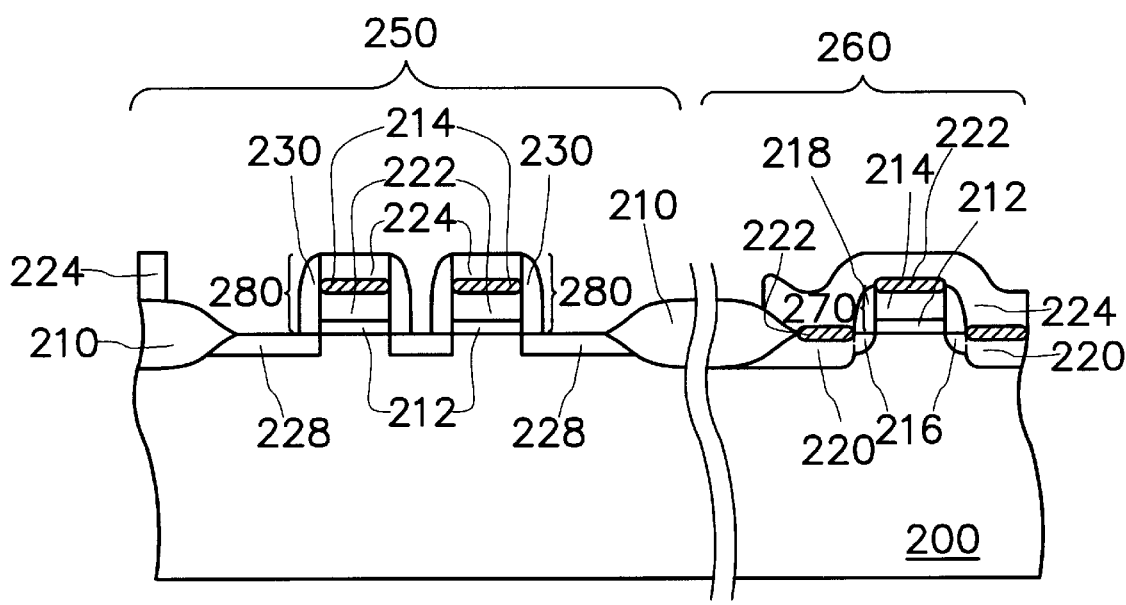

In FIG. 2D, an insulating layer 224 including, for example, silicon oxide is formed over the substrate 200 by, for example, an atmospheric chemical vapor deposition (APCVD) process. The insulating layer 224, the Salicide layer 222, the polysilicon layer 214 and the gate oxide layer 212 are patterned to form a gate structure 280 at the memory region 250. The periphery region 260 is not patterned in this patterning process. Up to this stage, the gate structure 280 includes a portion of the insulating layer 224, the Salicide layer 222, the polysilicon layer 214, and the gate oxide layer 212. Using the gate structure 280 as a mask, a lightly doped region 228 is formed in the substrate 200 on each side of the gate structure 280 at the memory region 250. A spacer 230 is formed on each sidewall of the gate structure 280. Using the insulating layer 224 as a mask, a heavily doped region (not shown) is formed over the lightly doped region 228 so as to form an second source/drain region on each side of the gate structure 280. After the insulating layer 224 is removed, a MOS transistor at the memory region 250 is formed.

Several subsequent fabrication processes, such as a formation of capacitor and a formation of an interconnect, a bit line, a word line, to accomplish the DRAM device are well known by the one skilled in the art and are not further described here. For example, one capacitor and one MOS transistor forms one memory cell at the memory region. The capacitor is coupled to the interchangeable source/drain region at one side of the gate. The bit line is coupled to the interchangeable source/drain region at the other side of the gate. The word line is coupled to the gate. The interconnect, for example, is formed to be coupled to the interchangeable source/drain region of the MOS transistor at the periphery region. The purpose of the interconnect is to have couplings between the memory cells and a periphery circuit in the periphery region. The periphery circuit includes several MOS transistors. The preferred embodiment shows only one for an example of descriptions.

In conclusion, the invention has characteristics as follows:

1. At the memory region 250 of the RRAM device, a Salicide layer is formed on the polysilicon layer of the gate so that a lower contact resistance on the gate of the MOS transistor is achieved. This can reduce a RC-delay time of the memory cells and results in a faster access speed on the memory cells, each of which includes the MOS transistor and one capacitor.

2. At the periphery region 260 of the RRAM device, all the gate and the first interchangeable source/drain region include the Salicide layer on their top so that data transmission speed can be improved due a reduced contact resistance on the MOS transistor. The reduces contact resistance allows a faster operation on the MOS transistor at the periphery region.

The invention has been described using an exemplary preferred embodiment. However, it is to be understood that the scope of the invention is not limited to the disclosed embodiment. On the contrary, it is intended to cover various modifications and similar arrangements. The scope of the claims, therefore, should be accorded the broadest interpretation so as to encompass all such modifications and similar arrangements.

What is claimed is:

1. A method for fabricating a DRAM device with a silicide layer on a gate of a MOS transistor in a memory region, the method comprising:

providing a semiconductor substrate, having the memory region and a periphery region;

sequentially forming a gate oxide layer and a polysilicon layer to cover both the memory region and the periphery region over the semiconductor substrate;

forming a first transistor at the periphery region, in which the first transistor comprises a first gate structure and a first interchangeable source/drain region, wherein the first gate structure comprises a portion of the polysilicon layer and the gate oxide layer remained after being patterned in the periphery region, and the polysilicon layer and the gate oxide layer at the memory region are remained to cover the whole memory region;

forming a silicide layer on the polysilicon layer remained in both the memory region and the periphery region and the first interchangeable source/drain region;

forming an insulation layer over the semiconductor substrate; and forming a second transistor at the memory region, in which the second transistor comprises a second gate structure and a second interchangeable source/drain region, wherein the second gate structure comprises a portion of the polysilicon layer and the silicide layer in the memory region remained after being patterned, while the second source/drain region is free of the silicide layer.

2. The method of claim 1, wherein the semiconductor substrate comprises a P-type silicon substrate.

3. The method of claim 1, wherein the method further comprises forming an interconnect electrically coupled to the first interchangeable source/drain region.

4. The method of claim 1, wherein the method further comprises forming a word line electrically coupled to the second gate structure.

5. The method of claim 1, wherein the method further comprises forming a capacitor electrically coupled to the second interchangeable source/drain region at one side of the second gate structure in the second transistor.

6. The method of claim 1, wherein the step of forming the metal layer comprises physical vapor deposition (PVD).

7. The method of claim 1, wherein the metal layer comprises titanium.

8. The method of claim 1, wherein the metal layer comprises cobalt.

9. The method of claim 1, wherein the metal layer comprises platinum.

10. The method of claim 1, wherein the step of forming a silicide layer comprises a step of a thermal process performed at a sufficiently high temperature to allow a reaction to occur at an interface between a metal layer formed on the polysilicon layer and the substrate and silicon material comprised in the polysilicon layer and the semiconductor substrate.

11. The method of claim 10, wherein after the step of performing the thermal process, a wet etching process is performed to remove the metal layer other than the silicide layer.

12. The method of claim 1, wherein the step of forming a silicide layer includes a step of forming a self-aligned silicide (salicide) layer formed by a self-aligned property.

13. The method of claim 1, wherein the insulating layer comprises silicon oxide.

14. The method of claim 1, wherein the step of forming the insulating layer comprises atmospheric chemical vapor deposition (APCVD).

15. The method of claim 1, wherein after the second transistor is formed, the insulating layer is removed.

16. A method of fabricating a DRAM comprising a memory region and a periphery region of a substrate, comprising:

forming a gate oxide layer and a polysilicon layer to cover both the memory region and the periphery region;

patterning the gate oxide layer and the polysilicon layer in the periphery region only to form a first gate in the periphery region, so that a portion of the substrate in the periphery region is exposed;

forming a first source/drain region on the exposed substrate in the periphery region;

forming a silicide layer on the polysilicon layer in the memory region, the gate and the first source/drain region;

patterning the silicide layer, the polysilicon layer and the gate oxide layer in the memory region only to form at least a second gate, so that a portion of the substrate in memory region is exposed; and forming a second source/drain region on the exposed substrate in the memory region.

* * * * *